United States Patent [19]
Kohama et al.

[11] Patent Number: 5,856,662
[45] Date of Patent: Jan. 5, 1999

[54] INFORMATION CARRIER AND PROCESS FOR PRODUCING SAME

[75] Inventors: Kyoichi Kohama, Toride; Wasao Takasugi, Higashiyamato; Kazuhiko Daido, Toride, all of Japan

[73] Assignee: Hitachi Maxell, Ltd., Osaka, Japan

[21] Appl. No.: 671,634

[22] Filed: Jun. 28, 1996

[30] Foreign Application Priority Data

Jun. 29, 1995 [JP] Japan .................................. 7-164038
Feb. 5, 1996 [JP] Japan .................................. 8-019129
Jun. 10, 1996 [JP] Japan .................................. 8-147345

[51] Int. Cl.$^6$ .................................................. G06K 19/06
[52] U.S. Cl. ........................................... 235/492; 235/488
[58] Field of Search ................................. 235/492, 382, 235/380, 487, 486, 488

[56] References Cited

U.S. PATENT DOCUMENTS

| 5,399,847 | 3/1995 | Droz | 225/488 |
| 5,585,618 | 12/1996 | Droz | 235/488 |

FOREIGN PATENT DOCUMENTS

| 0268830 | 6/1988 | European Pat. Off. | 235/488 |
| 0145696 | 7/1986 | Japan | 235/488 |
| 49650 | 3/1992 | Japan . | |
| 002267683 | 12/1993 | United Kingdom | 235/488 |

*Primary Examiner*—Thien Minh Le
*Attorney, Agent, or Firm*—Birch, Stewart, Kolasch & Birch, LLP

[57] ABSTRACT

The present invention is intended to provide an information carrier which has flat surfaces, is excellent in beautiful appearance, and permits necessary printing thereon after the production of the carrier, and a process for producing such a thin information carrier easily in high yield. The substrate 3 of the information storage carrier is composed of a material obtained by infiltrating a resin 8 into a reinforcer 7 made of a sheet-like material deformable in the direction of the thickness. An IC module 1 and a coil 2 are embedded in indents 34 formed by compressing the reinforcer 7 in the direction of the thickness, to smoothen both right and reverse sides of the substrate 3. Cover sheets 4 and 5 are attached to the right and reverse sides, respectively, of the substrate 3 with a bonding layer 6 to obtain the required information storage carrier. The substrate 3 having smooth right and reverse sides can be produced by placing the IC module 1 and the coil 2 on the aforesaid reinforcer impregnated with the resin and pressing the IC module 1 and the coil 2 until the surface of the resin layer and the surfaces of the IC module 1 and the coil 2 are placed on the same plane.

34 Claims, 17 Drawing Sheets

INFORMATION CARRIER AND PROCESS FOR PRODUCING SAME

BACKGROUND OF THE INVENTION

The present invention relates to an information carrier obtained by supporting on a substrate at least one fitting for, for example, storing, displaying or processing information, and a process for producing the same.

Various information carriers have been proposed which are obtained by supporting one or more parts such as IC chips on a substrate, store information, and give information to a reader-writer or receive information therefrom. Such information carriers are used for, for example, storing personal information on deposits, insurances, commutation tickets, licences, health, identification cards, etc., information on product management in factories, and information on commodity management in the commodity distribution field, or the employment of the information carriers for such purposes is investigated.

FIG. 29 and FIG. 30 are diagrams showing an example of such an information carrier which has been known: FIG. 29 is a partially sectioned plan view of the information carrier, and FIG. 30 a sectional view taken along the line 30—30 of FIG. 29. In these drawings, the symbol 100 shows an IC module; the symbol 101 a coil connected to the IC module 100; the symbol 102 a substrate supporting the IC module 100 and the coil 101; the symbol 103 a resin constituting the substrate 102; the symbol 104 a reinforcer for the resin 103; and the symbols 105 and 106 cover sheets attached to the right and reverse, respectively, sides of the substrate 102.

As is clear from these drawings, in this example of the information carrier, the IC module 100 and the coil 101 are placed in a cut-out hole 104a made in the reinforcer 104, and the space in the cut-out hole 104a is filled with the resin 103, which is infiltrated into the reinforcer 104, whereby the substrate 102 is formed. Since this example of the information carrier thus comprises the reinforcer 104 having the cut-out hole 104a, and the IC module 100 and the coil 101 placed in the cut-out hole 104a, a position in the substrate 102 at which the coil 101 is set can be accurately regulated by adjusting the size of the cut-out hole 104a to a suitable size for the coil 101, so that the efficient receipt of electric power from an external equipment and the efficient transmission of signals from or to the external equipment are possible.

The above well-known example of the information carrier, however, involves the following problem: since the IC module 100 and the coil 101 are placed in the cut-out hole 104a made in the reinforcer 104 and the resin 103 inside and outside the cut-out hole 104a is cured, the strength inside the cut-out hole 104a having no reinforcer 104 is low, so that when the information carrier receives an irregular external force, stress is centered on the inside of the cut-out hole 104a, resulting in easy cracking of the substrate 102.

Said information carrier also involves the following problem: since reinforcers 104 different in the size of the cut-out hole 104a have to be prepared depending on the sizes of the IC module 100 and the coil 101 which are to be placed in the cut-out hole 104a, a complicated production process is required when various information carriers are produced in the same line.

In addition, in the above well-known example of the information carrier, the reinforcer 104 is made of, for example, woven fabric obtained by plain weave of glass fiber, so that when the cut-out hole 104a is made by cutting the reinforcer 104, the glass fiber is frayed and stuck out of the cut surface to cause the following phenomenon: as shown in FIG. 31, the frayed glass fiber 107 juts out into the inside of the cut-out hole 104a or extends above or below the reinforcer 104.

When the frayed glass fiber 107 juts out into the inside of the cut-out hole 104, the following disadvantage is brought about: as shown in FIG. 32, the thickness of a portion where the IC module 100 and/or the coil 101 overlaps with the glass fiber 107 exceeds the thickness of the substrate 102, so that the surface flatness of the substrate 102 and hence that of the cover sheets 105 and 106 are deteriorated. When the frayed glass fiber 107 extends above or below the reinforcer 104, the thickness of such a portion is larger than that of the other portion of the substrate 102, so that the flatness of the cover sheets 105 and 106 is deteriorated. When the flatness of the cover sheets 105 and 106 is deteriorated, the beautiful appearance and the ease of handling are deteriorated, resulting in a decreased commercial value. Furthermore, in the case of an information carrier in which, for example, a photograph of owner's face is printed on the surface of the cover sheet 105 or 106 after the production of the information carrier, there is a disadvantage in that the photograph of the face cannot be clearly printed.

Since the woven fabric obtained by plain weave of glass fiber is hardly compressible in the direction of the thickness, pressing of the substrate 102 cannot remove the thickness nonuniformity of the substrate 102 and moreover tends to destroy the IC module 100 and the coil 101. The abovementioned disadvantage can be removed by stopping the fraying, for example, by hardening and fixing the glass fiber 107 frayed and stuck out of the cut surface with a resin before inserting the IC module 100 and the coil 101 into the cut-out hole 104a, but a production process of the information carrier becomes complicated as much, resulting in an increased production cost of the information carrier. Therefore, this method cannot be said to be a preferable method.

The present invention was made for solving such problems and objects thereof are to provide an information carrier having a high resistance to external force (e.g. flexure) and such a flat surface that it is excellent in beautiful appearance and permits good necessary printing, and to provide a production process which makes it possible to produce such an information carrier easily in high yield.

Figure 1:
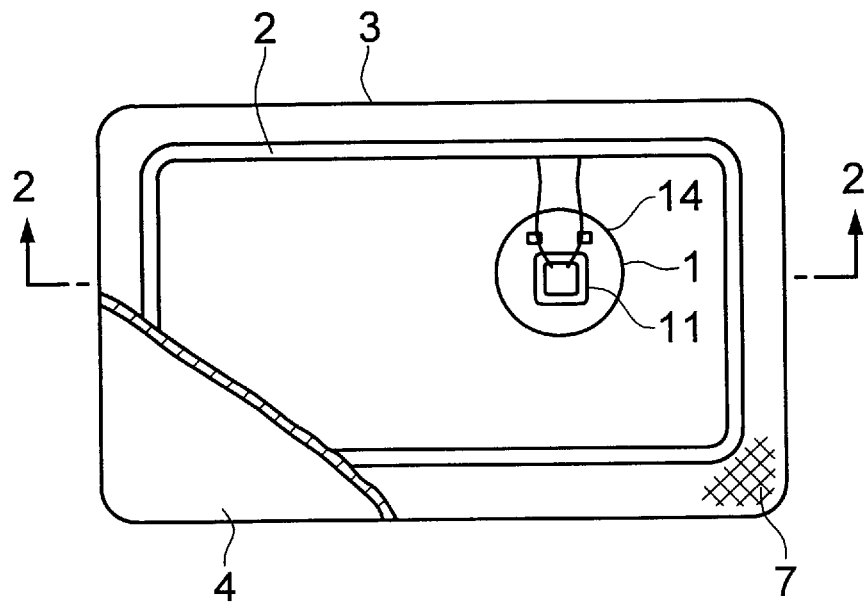
FIG. 1 is a partially sectioned plan view of an information carrier according to a first embodiment.

In the above drawings, the numerals denote the followings.

1 : IC module.
2 : coil.
3 : substrate.
3a: first component.
3b: second component.
4 : top cover sheet.
5 : bottom cover sheet.
6 : bonding layer.
7, 7a, 7b and 7c: reinforcers.
7d: through hole.
7e: first component.
7f: second component.
8 : resin.
11: IC chip.
12: protective frame.
13: through hole.
14: relay terminal.
15: adhesive.
31: surface plate.
32: frame.
33: press plate.
41: bottom force.
42: top force.
41a and 42a: cavities.
43: mold.
51: insulating substrate.
52: electric conduction pattern.
53: electronic part.
61: magnetism-positioning means.
71: external equipment.
72: coil.
73: carrier-positioning means.
81: circuit pattern.
82: terminal area.

SUMMARY OF THE INVENTION

For solving the problems described above, the present invention employs the following structure of an information carrier: in an information storage carrier comprising a substrate of necessary shape and size and at least one fitting supported on the substrate. The aforesaid substrate is composed of a material which consists of at least one sheet-like reinforcer deformable as a simple in the direction of the thickness and a resin applied on or infiltrated into the reinforcer(s) and so as to retain a definite shape and strength after curing of the resin. The aforesaid fitting(s) is embedded in a hollow(s) formed by deforming a portion(s) of the aforesaid reinforcer(s) more than the other portion.

As the reinforcer(s) for the resin which constitutes the substrate, deformable materials can be used so that the fitting(s) can be embedded in the direction of thickness of the materials, for example, woven fabric, knitted fabric, nonwoven fabric, paper, leather, sheet-like materials having deformability imparted by a chemical or thermal treatment, or combinations thereof. As the aforesaid fitting(s), various fittings such as IC chips, IC modules, means for contactless transmission of data and/or an electric source, electrode terminals for transmission of data and/or an electric source, capacitors, resistors, solar cells, liquid crystal display devices, image displayers, optical recording media, magneto-optical recording media, magnets or ferromagnetic materials for locating the information carrier at the carrier-setting position of a reader-writer with high precision may be used. Therefore, as the aforesaid reinforcer(s), at least one reinforcer is chosen having a deformability suitable for the shape of the fitting(s). For example, when the fitting is a thin part such as a bare chip a, woven fabric may be used having almost no compressibility, such as plain weave fabric. On the other hand, when the fitting is a relatively thick part such as an IC module, it is necessary to choose a reinforcer having high compressibility and deformability, such as pile fabric.

When a reinforcer having a deformability suitable for the shape of the fitting(s) in the direction of the thickness is thus used as the reinforcer for the resin which constitutes the substrate of the information carrier, a portion(s) of the reinforcer at which the fitting(s) is to be set can be elastically indented when producing the information carrier, by placing the fitting(s) on the substrate and pressing the fitting(s) from above, or by expanding the aforesaid resin after placing the fitting(s), the reinforcer, and the resin in a mold. Since the fitting(s) can be accommodated in the indention(s), it is not necessary to make a cut-out hole in the reinforcer.

Therefore, the reinforcer is present throughout the substrate, so that even when the substrate receives an irregular external force such as flexure, stress is not centered on only a part of the substrate. Thus, an information carrier can be produced which is hardly cracked and is very durable. In addition, information carriers with different types and sizes of fitting can be produced using the same kind of reinforcer, so that inexpensive information carriers can be produced with high productivity. Furthermore, flat surfaces can be formed as the right and reverse sides of the substrate because the fibers of the reinforcer do not fray and stick out of a cut surface, jut out into the inside of a cut-out hole to overlap the fitting(s), or extend above or below the reinforcer. Therefore, the appearance of the information carrier can be satisfactorily preserved in the case of an information carrier in which, for example, a photograph of owner's face is printed on the surface of the substrate or the surface of a cover sheet attached to the surface of the substrate, the photograph can be clearly printed. In addition, practice at low cost is possible because an extra treatment for stopping the fraying of reinforcing fiber may be omitted.

A process for producing the above-mentioned information carrier comprises: a step of placing at least one reinforcer on a surface plate. The reinforcer is deformable in the direction of its thickness and coated or impregnated with a resin; a step of placing at least one fitting on the reinforcer(s) coated or impregnated with resin, with positioning; a step of compressing the fitting(s) from above to compress said reinforcer(s) in the direction of the thickness, and to deform said reinforcer(s) in the direction of the thickness so as to embed said fitting(s) in the reinforcer(s) coated or impregnated with resin; and a step of curing said resin.

In the step of placing the reinforcer(s) coated or impregnated with a resin on the surface plate, the reinforcer(s) coated or impregnated with the resin may be placed in a frame resting on the surface plate. When the reinforcer(s) is thus placed, the thickness and shape of the substrate, and a position in the substrate where the fitting(s) is embedded, can be regulated by pressing said fitting(s) from with a pressing member above said frame to press the fitting(s) until the pressing surface of the pressing member comes into contact with the top surface of said frame.

In the step of placing the reinforcer(s) coated or impregnated with a resin on the aforesaid surface plate, it is also possible to place the reinforcer(s) on the surface plate without a frame. In this case, the thickness and shape of the substrate and a position in the substrate where the fitting(s) is embedded can be regulated by pressing a pressing member whose height above said surface plate is regulated.

For the aforesaid pressing member, a press plate or press roller can be used.

In another arrangement, there may be employed a method involving a step of placing at least one necessary fitting in the cavity of a mold with positioning; a step of placing at least one reinforcer having deformability in the direction of the thickness and coated or impregnated with a resin containing reactants on the fitting(s); a step of clamping the top force and the bottom force of said mold; and a step of reacting said resin to cure the same.

These processes for producing an information carrier have characteristic effects due to the following action.

As as described above, in conventional information carriers, for example, woven fabric (obtained by plain weave of incompressible single yarn or twisted yarn, such as glass fiber) is used as a reinforcer for a resin which constitutes a substrate, because of its high strength and excellent heat resistance. But such woven fabric has a smooth surface and is hardly compressible in the direction of the thickness. Therefore, when its substrate is shaped after placing at least one fitting on the reinforcer, the fitting(s) tends to be displaced in the direction of surface of the reinforcer by resin flow caused by application of a pressing force. It is that therefore difficult to set the fitting(s) at a predetermined position with high precision. Accordingly, the fitting(s) cannot be conventionally positioned with high precision unless a cut-out hole is made in the reinforcer, followed by placing the fitting(s) therein, as in the above-mentioned well-known example of information carrier.

By contrast, when a sheet-like material easily deformable in the direction of the its thickness is used as a reinforcer for a resin, placing at least one fitting on the reinforcer coated or impregnated with resin and pressing the fitting(s) from above make it possible to compress only a portion(s) having the fitting(s) placed thereon, elastically to indent the same. When the reinforcer is indented, the indent(s) serves as a barrier(s) to resin flow, so that irregular movement of the fitting(s) can be prevented without any special treatment for stopping the flow. Therefore, the fitting(s) can be positioned with high precision.

Accordingly, when the fitting is a coil, the coil can be placed exactly opposite to the coil of a reader-writer with high precision, so that efficient receiving of electric power and efficient giving and receiving of signals are possible. When the fitting is an IC module having a coil connected thereto, irregular tension on the junction of the coil with and the IC module can be prevented, so that the reliability and durability of the information carrier can be enhanced.

DESCRIPTION OF THE PREFERRED EMBODIMENTS

First Embodiment

Figure 2:
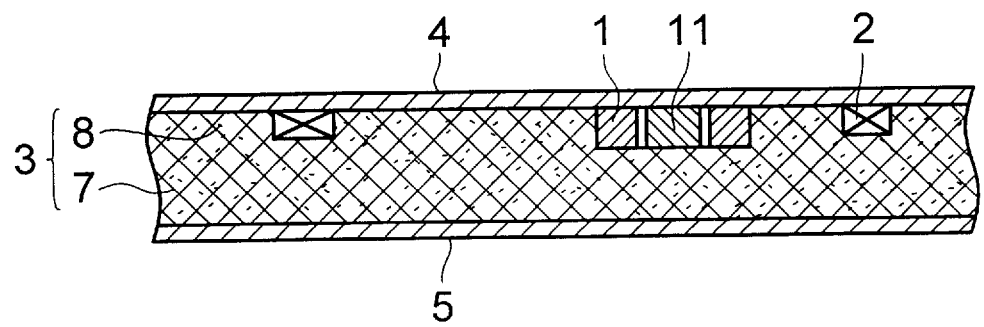
FIG. 2 is a cross-sectional view taken along the line 2—2 of FIG. 1.

A first example of the information carrier of the present invention is explained below with reference to FIG. 1 to FIG. 9. FIG. 1 is a partially sectioned plan view of this example of the information carrier. FIG. 2 is an enlarged cross-sectional view taken along the line 2—2 of FIG. 1. FIG. 3 to FIG. 8 are illustrations of IC modules to be supported on said information carrier. FIG. 9 is a chart illustrating a process for producing said information carrier.

As is clear from FIG. 1 and FIG. 2, this example of the information carrier is composed of an IC module 1, a coil 2 for contactless transmission of data and/or an electric source, a substrate 3, a top cover sheet 4 and a bottom cover sheet 5. The substrate 3 is composed of a reinforcer 7 and a resin 8 applied on or infiltrated into the reinforcer 7.

An IC module having any of various known structures is used according to need.

Figure 3:
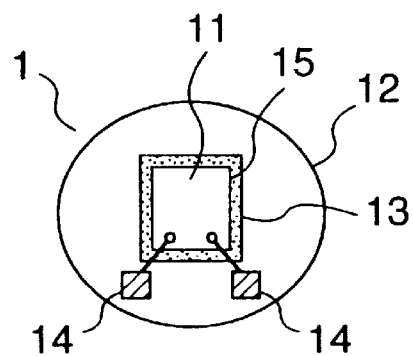
FIG. 3 is a plan view of a first example of IC module.
Figure 4:
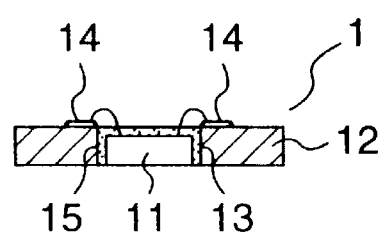
FIG. 4 is a cross-sectional view of the first example of IC module.
Figure 5:
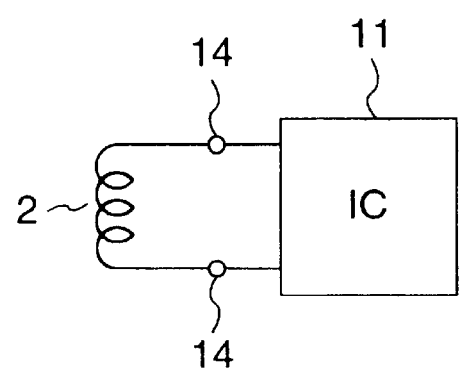
FIG. 5 is a circuit diagram of the first example of IC module.

FIG. 3 to FIG. 5 are diagrams showing a first example of the IC module 1: FIG. 3 is a plan view, FIG. 4 is a cross-sectional view, and FIG. 5 is circuit diagram of a circuit composed of the IC module 1 and the coil 2.

As is clear from these drawings, this example of the IC module 1 is composed of an IC chip 11 and a protective frame 12. The IC chip 11 comprises, for example, a memory, a transmit-receive circuit and a control circuit, and achieves both contactless transmission of signals from or to external equipment (a reader-writer) through the coil 2, and the storage of necessary information. The protective frame 12 has a thickness equal to or larger than that of the IC chip 11 and has in its central portion a through hole 13 into which the IC chip 11 can be inserted. On the surface of the protective frame 12, relay terminals 14 for connecting the IC module 1 to the coil 2 are formed from an electric conductor. The protective frame 12 is made of a well-known material for substrate, such as glass-reinforced epoxy resin. The IC chip 11 is placed in the through hole 13 and attached to the inner surface of the protective frame 12 with an adhesive 15. As the adhesive 15, an adhesive more flexible than the protective frame 12 is preferably used, in order to reduce an external force applied to the IC chip 11 through the protective frame 12 and the adhesive 15. For example, when the protective frame 12 is made of a glass-reinforced epoxy resin, a hor-melt adhesive can be used as the adhesive 15. The pads of the aforesaid IC chip 11 are connected to the relay terminals 14, respectively, of the aforesaid protective frame 12 by any conventional connecting method such as wire bonding, TAB (Tape Automated Bonding) or printed wiring. Printed wiring is particularly preferred because it permits wiring using relatively simple equipment and reduces the total thickness of the IC module 1. The shape and size of the protective frame 12 may be varied if necessary. When a single IC chip 11 (3 to 4 mm square) is used, the diameter (in the case of a round shape) of the protective frame 12 can be adjusted to about 15 mm.

In the present example of the IC module 1, the IC chip 11 is placed in the through hole 13 made in the protective frame 12, so that the IC module 1 is thin compared with an IC chip mounted on a protective plate. Moreover, since the IC chip 11 and the protective frame 12 are joined together with an adhesive which is more flexible than the protective frame 12, an external force applied to the IC chip 11 can be reduced, so that the fracture of the IC chip 11 can be prevented.

Figure 6:
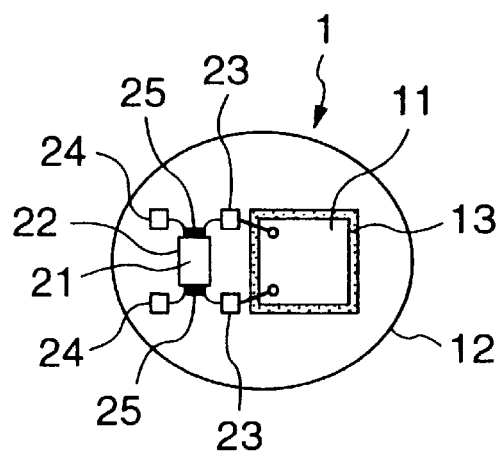
FIG. 6 is a plan view of a second example of IC module.
Figure 7:
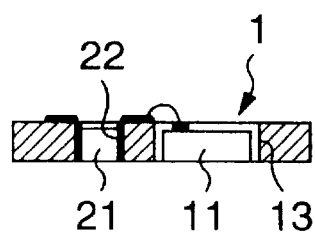
FIG. 7 is a cross-sectional view of the second example of IC module.
Figure 8:
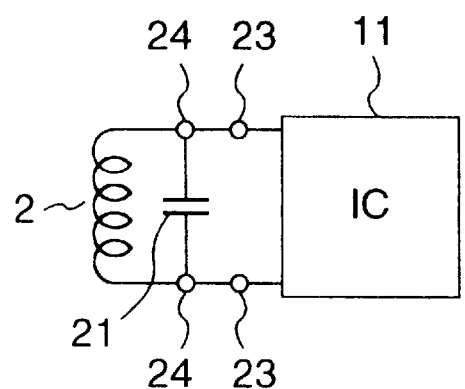
FIG. 8 is a circuit diagram of the second example of IC module.
Figure 9:
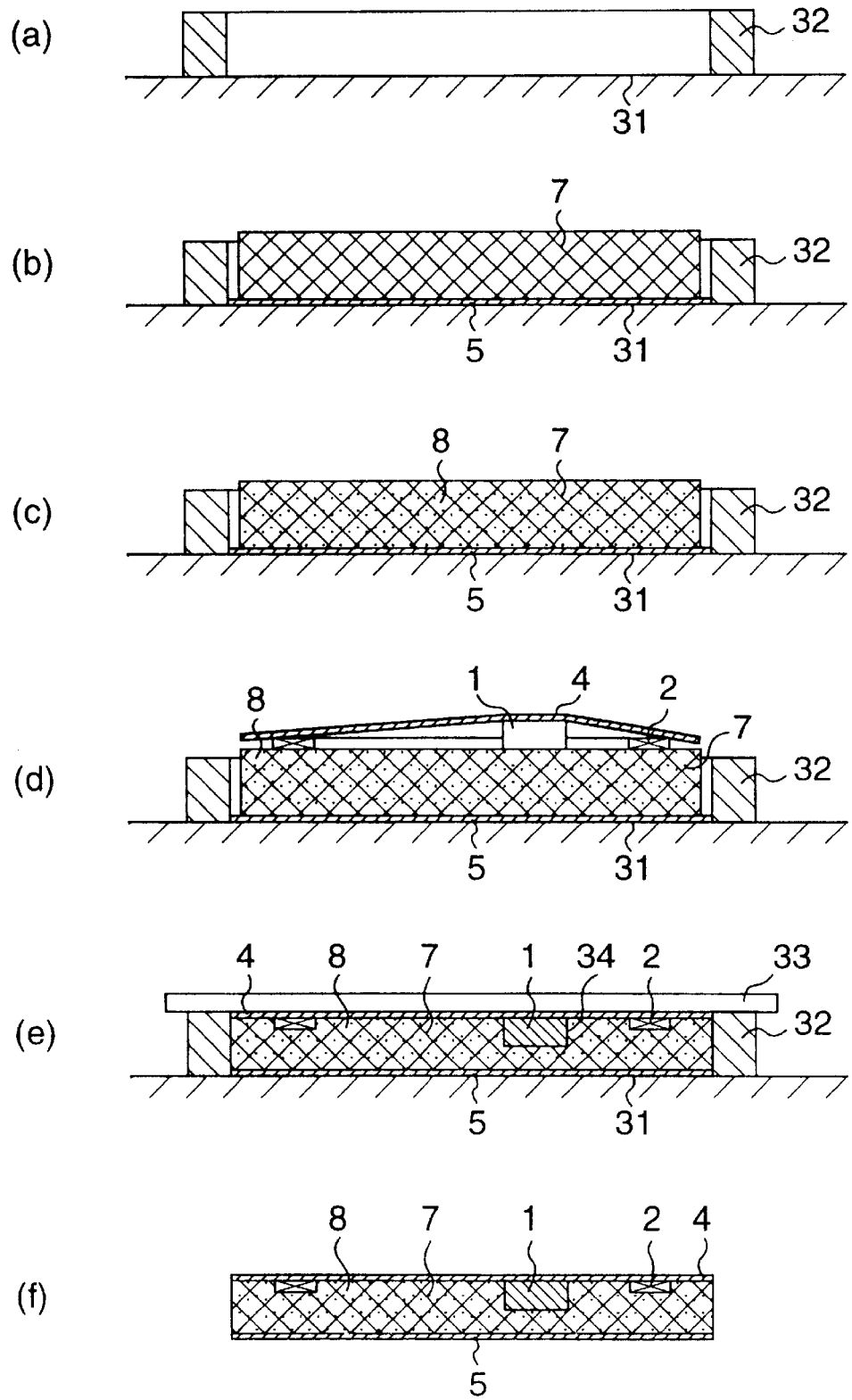
FIG. 9 is a chart illustrating a production process of the information carrier according to the first embodiment.

FIG. 6 to FIG. 8 are diagrams showing a second example of the IC module: FIG. 6 is a plan view, FIG. 7 is a cross-sectional view, and FIG. 8 is circuit diagram of a circuit composed of this IC module 1 and the coil 2.

As is clear from these drawings, this example of the IC module 1 is composed of an IC chip 11, a protective frame 12 and a resonant capacitor 21. The protective frame 12 has a thickness equal to or larger than that of an electric part which is the thicker of the IC chip 11 and the resonant capacitor 21. It has a through hole 13 into which the IC chip 11 can be inserted and a through hole 22 into which the resonant capacitor 21 can be inserted. On the surface of the protective frame 12, relay terminals 23 for connecting the IC module 1 to the resonant capacitor 21 and relay terminals 24 for connecting the resonant capacitor 21 to the coil 2 are formed of an electric conductor. On the facing wall surfaces of the through hole 22, electrode terminals 25 for connecting the two electrodes of the capacitor 21 are formed of an electric conductor. The relay terminals 23 and 24 and the electrode terminals 25 are patterned so as to communicate with one another. Since other parts are the same as in the above-mentioned first example of the IC module 1, explanation of the other parts is omitted to avoid duplication. The present example of the IC module 1 has the same effect as that of the above-mentioned first example of the IC module 1.

The coil 2 receives electric power from a coil provided in an external piece of equipment and makes signal transmission from or to a coil provided in the external equipment. As the coil 2, there is used a coil obtained by winding a conductor a predetermined number of times and forming the wound coil into predetermined shape and size. The ends of the coil 2 are connected to the IC chip 11 through the relay terminals 23 and 24.

As the reinforcer 7 which constitutes the substrate 3, any kind of woven fabric can be used, such as, knitted fabric, nonwoven fabric, paper, leather, sheet-like materials having deformability imparted by a chemical or thermal treatment, or a combination thereof. Example of sheet-like materials having deformability imparted by a chemical or thermal treatment, are synthetic resin sheets softened by a solvent, or hot-melt resin sheets softened by heating.

Example of woven fabric, knitted fabric or nonwoven fabric, are, for example, glass fiber, carbon fiber, Kevlar fiber, chemical fiber and natural fiber, or a mixture of two or more fibers selected from these fibers. Examples of woven fabric or knitted fabric are any woven or knitted fabric which has been given a necessary compressibility in the direction of the thickness. Preferably, woven or knitted fabric woven from compressible single yarn or doubled and twisted yarn; woven fabric or knitted fabric composed of an upper layer and a lower layer that are formed by plain weave, and vertical fiber connecting the upper and lower layers; and woven fabric or knitted fabric obtained by raising looped fibers from one side or both sides of cloth produced by plain weave are used. As to the deformation rate in the direction of thickness of the reinforcer 7, it is sufficient that the reinforcer 7 can be deformed to such a degree that the IC module 1 as a simple can be completely embedded in the reinforcer 7 as shown in FIG. 2.

For resin 8 which constitutes the substrate 3, any well-known resin material can be used, and a resin selected from ultraviolet-setting resins, thermosetting resins or reaction-setting resins is particularly preferable.

The top cover sheet 4 is a card of substantially the same shape and size as the aforesaid substrate 3, made from a resin material such as poly(ethylene terephthalate). On its surface, the trade name of the information carrier, the name of a maker of the information carrier, other logos, etc. are printed as a design. If necessary, image information such as a photograph of the face of card owner is printed on the surface of the cover sheet 4.

The bottom cover sheet 5 is similarly produced as a card of substantially the same shape and size as the aforesaid substrate 3 by using a resin material such as poly(ethylene terephthalate). On its surface, precautions necessary in handling the information carrier, arrangements with a publisher, etc. are printed as a design. The top cover sheet 4 and the bottom cover sheet 5 are attached directly to the surfaces of the aforesaid substrate 3.

In the present example of the information carrier, since the sheet-like material deformable in the direction of the thickness is used as the reinforcer 7 for the resin which constitutes the substrate 3 of the information carrier, the IC module 1 is placed on the substrate 3 in the production of the information carrier and the IC module 1 is pressed from above, whereby the pressed portion of the reinforcer can be elastically indented. The IC module 1 can be accommodated in the indent, so that it is not necessary to make a cut-out hole in the reinforcer 7. Therefore, the reinforcer 7 is present throughout the substrate 3, so that even when the substrate 3 receives an irregular external force such as flexure, stress is not centered on a particular part of the substrate. Thus, an information carrier can be produced which is hardly cracked and is very durable. In addition, information carriers with different kinds and sizes of a fitting can be produced using the same reinforcer 7, so that inexpensive information carriers can be produced efficiently. Furthermore, smooth surfaces can be formed as the right and reverse sides of the substrate because the following phenomenon does not occur: glass fiber is frayed and sticks out of a cut surface and juts out into the inside of a cut-out hole to overlap with the IC module or the coil, or extends above or below the reinforcer 7. Therefore, the appearance of the information carrier can be made satisfactorily beautiful. For an information carrier in which image information is printed on the surface of the substrate 3 or the surfaces of the cover sheets 4 and 5 attached to the surfaces of the substrate 3, a photograph of a face can be clearly printed. In addition, practice at low cost is possible because an extra treatment for stopping the fraying of frayed glass fiber may be omitted.

An example of process for producing the present example of the information carrier is explained below.

(i) As shown in FIG. 9(a), a frame 32 having a thickness t equal to that of a desired substrate and an inner surface configuration equal to the shape and projected area of a desired information carrier is placed on a surface plate 31.

(ii) As shown in FIG. 9(b), a bottom cover sheet 5 and a reinforcer 7, which is made of a sheet-like material deformable in the direction of is thickness and which has an outer surface configuration that is the same as or somewhat smaller than the inner surface configuration of the frame 32, are placed in the frame 32, in that order.

(iii) As shown in FIG. 9(c), a resin 8 is injected into the frame 32 and applied on or infiltrated into the reinforcer 7 placed in the frame 32.

(iv) As shown in FIG. 9(d), an IC module 1 and a coil 2 are placed at predetermined positions, respectively, on the resin 8. In addition, a top cover sheet 4 is placed thereon with positioning.

(v) As shown in FIG. 9(e), a press plate 33 larger than the outer shape of the frame 32 is put on the top cover sheet 4, and the IC module 1 and the coil 2 are pressed downward until the under surface of the press plate 33 comes into contact with the top surface of the frame 32. In this procedure, portions of the reinforcer 7 on which the IC module 1 and the coil 2 have been placed are elastically compressed, and the indents 34 thus formed accommodate the IC module 1 and the coil 2. Moreover, the resin 8 extends around the IC module 1 and the coil 2 compactly, whereby these electronic parts are encapsulated. In addition, the resin 8 gets in all parts of the space defined by the surface plate 31, the frame 32 and the press plate 33, whereby a substrate 3 of a predetermined shape is molded.

(vi) The resin 8 is cured by a curing means suitable for the kind of the resin 8, after which the information carrier having the embedded IC module 1 and coil 2 is taken out of the frame 32.

(vii) Finally, the peripheral portion of the information carrier taken out is cut to obtain the information carrier of a required shape and a required size shown in FIG. 9(f).

In the present example of process for producing the information carrier, woven fabric or nonwoven fabric, which is deformable in the direction of the thickness is used as the reinforcer 7 for the resin 8, and therefore when the IC module 1 and the coil 2 are placed on the reinforcer 7 impregnated with the resin 8, and pressed from above, portions on which the IC module 1 and the coil 2 have been placed can be elastically compressed alone to be indented. When the indents are formed in the reinforcer 7, their edges serve as barriers to a resin flow, so that irregular movement of the IC module 1 and the coil 2 can be prevented without any special treatment for stopping the flow. Therefore, they can be positioned with high precision. Accordingly, the coil can be placed exactly opposed to the coil of a piece of external equipment with high precision, so that efficient receiving of electric power and efficient transmitting and receiving of signals are possible. As to the IC module, no irregular tension is applied to the junction of the coil with the IC module, so that the reliability and durability of the information carrier can be enhanced.

Second Embodiment

Figure 10:
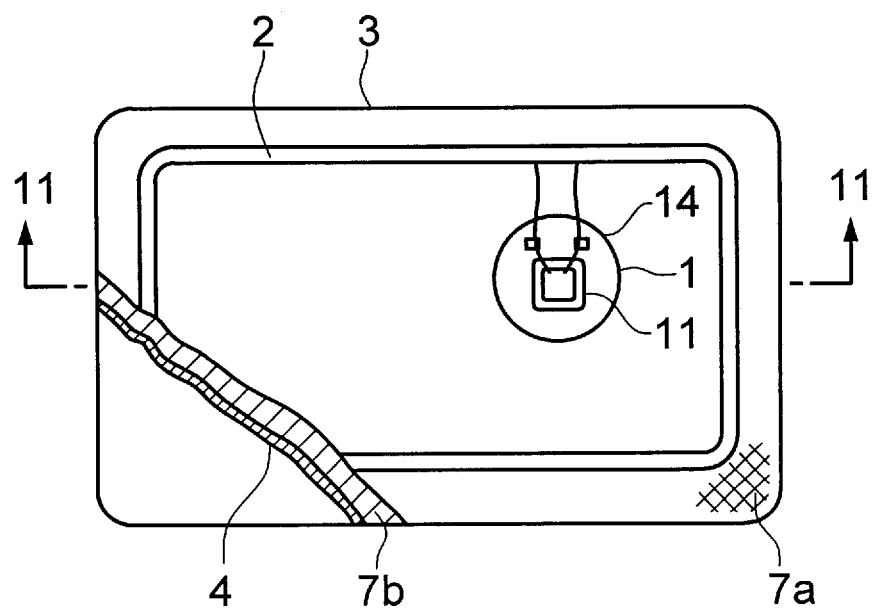
FIG. 10 is a partially sectioned plan view of an information carrier according to a second embodiment.
Figure 11:
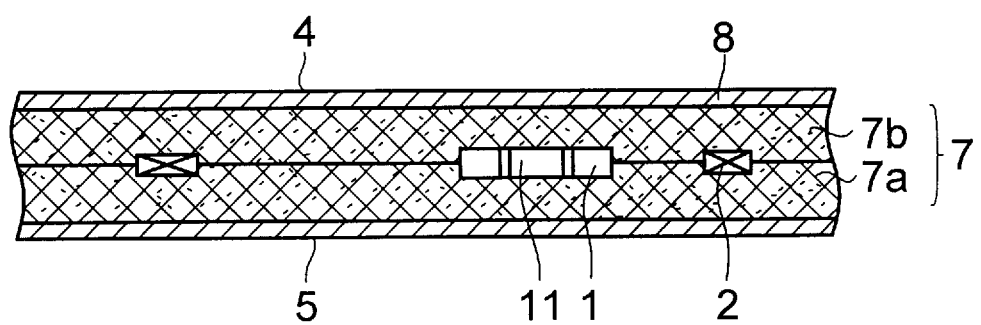
FIG. 11 is a cross-sectional view taken along the line 11—11 of FIG. 10.
Figure 12:
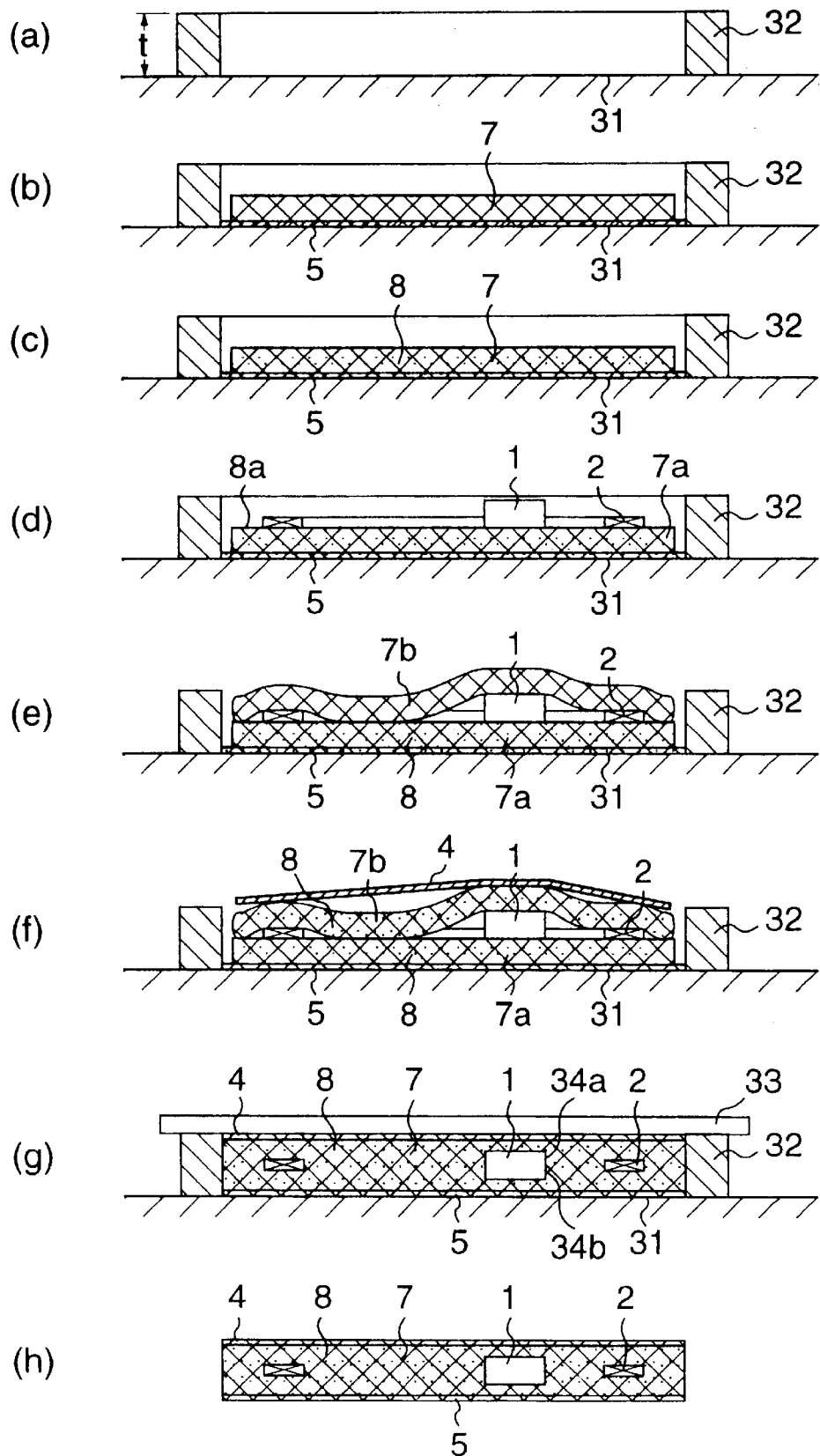
FIG. 12 is a chart illustrating a production process of the information carrier according to the second embodiment.

A second example of the information carrier of the present invention is explained below with reference to FIG. 10 to FIG. 12. FIG. 10 is a partially sectioned plan view of this example of the information carrier. FIG. 11 is an enlarged cross-sectional view taken along the line 11—11 of FIG. 10. FIG. 12 is a chart illustrating a process for producing said information carrier.

As is clear from FIG. 10 and FIG. 11, the present example of the information carrier includes a substrate 3 is composed of a first reinforcer 7a, a second reinforcer 7b and a resin 8 infiltrated into them. An IC module 1 and a coil 2 are embedded or sandwiched between the aforesaid first reinforcer 7a and second reinforcer 7b. Since other parts are the same as in the information carrier according to the first embodiment, explanation of the other parts is omitted to avoid duplication.

The present example of the information carrier has the same effect as the information carrier according to the above-mentioned first embodiment. In addition, since the first reinforcer 7a and the second reinforcer 7b are located on the top surfaces and the under surfaces of the IC module 1 and the coil 2, the strength of the substrate 3 and its protective effect on the electronic parts 1 and 2 can be enhanced compared with the information carrier according to the first embodiment, so that a contactless type information carrier with even better reliability can be produced.

An example of process for producing the present example of the information carrier is explained below.

(i) As shown in FIG. 12(a), a frame 32 having a thickness t equal to that of a desired substrate and an inner surface configuration equal to the shape and projected area of a desired information carrier is placed on a surface plate 31.

(ii) As shown in FIG. 12(b), a bottom cover sheet 5 and a first reinforcer 7a, which is made of a sheet-like material deformable in the direction of its thickness and which has an outer surface configuration that is the same as or somewhat smaller than the inner surface configuration of the frame 32, are placed in the frame 32 in that order.

(iii) As shown in FIG. 12(c), a resin 8 is injected into the frame 32 and applied on or infiltrated into the first reinforcer 7a placed in the frame 32.

(iv) As shown in FIG. 12(d), an IC module 1 and a coil 2 are placed at predetermined positions, respectively, on the resin 8.

(v) As shown in FIG. 12(e), a second reinforcer 7b similar to the first reinforcer 7a is placed on the IC module 1 and the coil 2 which have been placed on the resin 8.

(vi) As shown in FIG. 12(f), resin 8 is injected into the frame 32 again and applied on or infiltrated into the second reinforcer 7b placed in the frame 32. In addition, a top cover sheet 4 is placed thereon.

(vii) As shown in FIG. 12(g), a press plate 33 larger than the outer shape of the frame 32 is put on the top cover sheet 4, and the contents of the frame 32 are pressed downward until the under surface of the press plate 33 comes into contact with the top surface of the frame 32. In this procedure, portions of the first reinforcer 7a and the second reinforcer 7b, between which the IC module 1 and the coil 2 have been placed, are elastically compressed. The hollows 34a and 34b thus formed accommodate the IC module 1 and the coil 2. Moreover, the resin 8 extends around the IC module 1 and the coil 2 compactly, whereby these electronic parts are encapsulated. In addition, the resin 8 gets in all parts of the space defined by the surface plate 31, the frame 32 and the press plate 33, whereby a substrate 3 of a predetermined shape is molded.

(viii) The resin 8 is cured in a manner suitable for the kind of the resin 8 used, after which the information carrier, including the embedded IC module 1 and coil 2, is taken out of the frame 32.

(ix) Finally, a peripheral portion of the information carrier taken out is cut to obtain the information carrier of a required shape and a required size.

The present example of production process has the same effect as that of the process for producing the information carrier according to the above-mentioned first embodiment.

Third Embodiment

Figure 13:
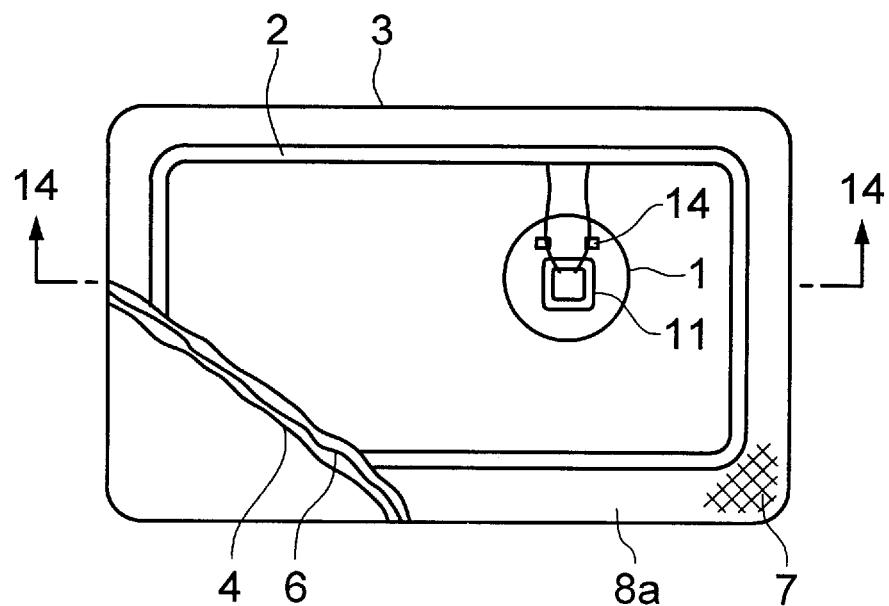
FIG. 13 is a partially sectioned plan view of an information carrier according to a third embodiment.
Figure 14:
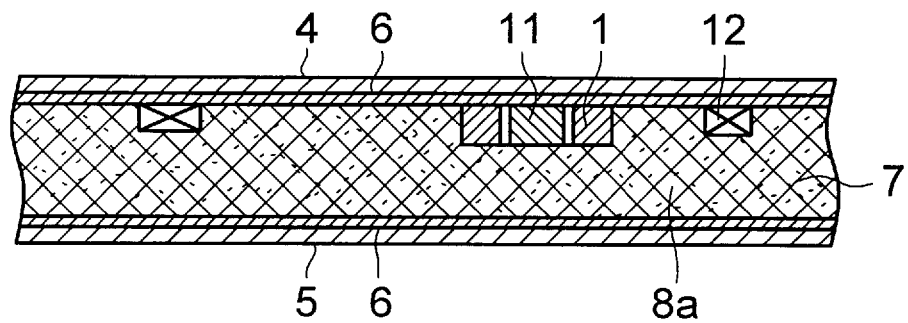
FIG. 14 is a cross-sectional view taken along the line 14—14 of FIG. 13.
Figure 15:
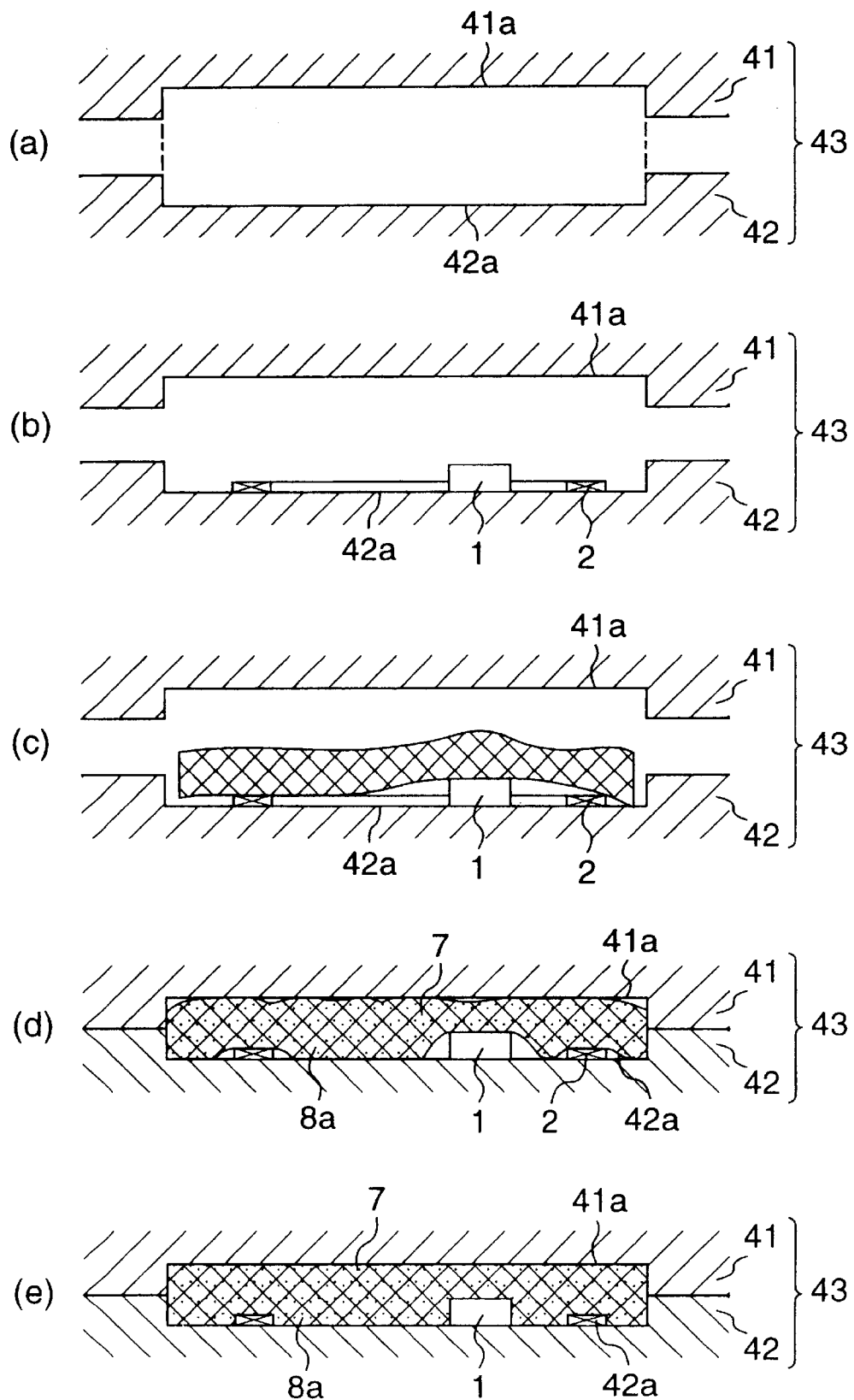
FIG. 15 is a chart illustrating a production process of the information carrier according to the third embodiment.

A third example of the information carrier of the present invention is explained below with reference to FIG. 13 to FIG. 15. FIG. 13 is a partially sectioned plan view of this example of the information carrier. FIG. 14 is an enlarged cross-sectional view taken along the line 14—14 of FIG. 13. FIG. 15 is a chart illustrating a process for producing said information carrier.

As is clear from FIG. 13 and FIG. 14, the present example of the information carrier includes a substrate 3 composed of a reinforcer 7 and a reaction-setting resin 8a infiltrated thereinto. Since other parts are the same as in the information carrier according to the first embodiment, explanation of the other parts is omitted for avoiding duplication. The present example of the information carrier has the same effect as that of the information carrier according to the above-mentioned first embodiment.

An example of process for producing the present example of the information carrier is explained below.

(i) As shown in FIG. 15(a), there is a mold 43 includes cavities 41a and 42a having inner shapes corresponding to the shape of a desired substrate 3 formed in the opening surfaces of a bottom force 41 and a top force 42.

(ii) As shown in FIG. 15(b), an IC module 1 and a coil 2 are placed in the cavity 41a formed in the bottom force 41 separated from the top force 42.

(iii) As shown in FIG. 15(c), on the IC module 1 and the coil 2, there is taken in a reinforcer 7 which is made of a sheet-like material deformable in the direction of the thickness and has an outer surface configuration that is the same as or somewhat smaller than the inner surface configuration of the cavity 41a.

(iv) As shown in FIG. 15(d), the bottom force 41 and the top force 42 are united, after which a reaction-setting resin 8a containing reactants is injected into the cavities 41a and 42a and applied on or infiltrated into the reinforcer 7 previously placed in the cavity 31a.

(v) The resin is reacted, and utilizing the pressure developed by the reaction, the resin 8a is allowed to reach every part in the cavities 41a and 42a as shown in FIG. 15(e). The reinforcer 7 is pressed against the IC module 1 and the coil 2 to embed the IC module 1 and the coil 2 in the reinforcer 7.

(vi) After the solidification of the resin 8a, the bottom force 41 and the top force 42 are separated and the substrate 3 is taken out.

(vii) Finally, a top cover sheet 4 and a bottom cover sheet 5 each of which has a design or the like printed thereon are attached to the surfaces of the substrate 3. Thereafter, the peripheral portion of the information carrier having the cover sheets attached thereto is cut to obtain the information carrier having a required shape and a required size.

The present example of production process has the same effect as that of the process for producing the information carrier according to the above-mentioned first embodiment. Moreover, it permits even greater improvement in manufacturing productivity than the production process according to the first embodiment because rapid molding of the substrate 3 is possible using the reaction-setting resin 8a as a resin which constitutes the substrate 3.

Fourth Embodiment

Figure 16:
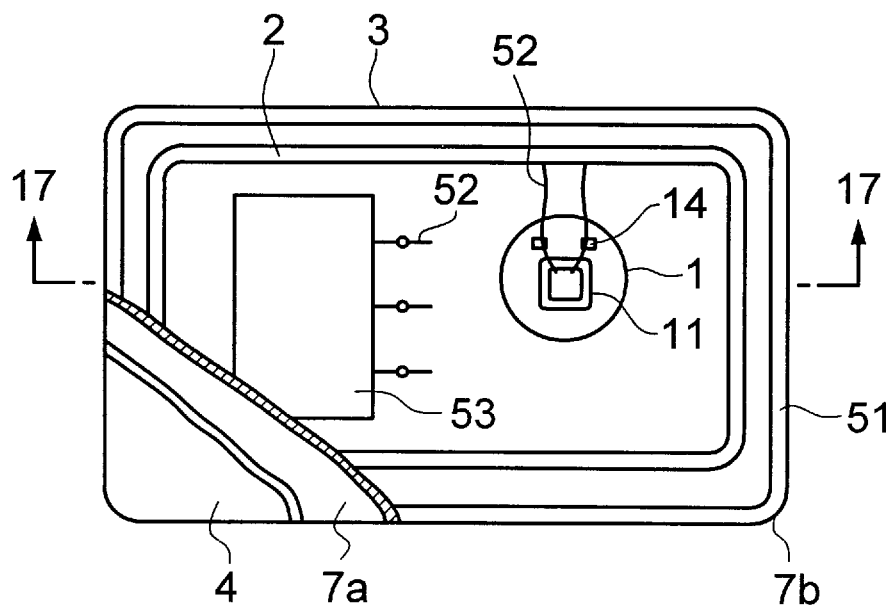
FIG. 16 is a partially sectioned plan view of an information carrier according to a fourth embodiment.
Figure 17:
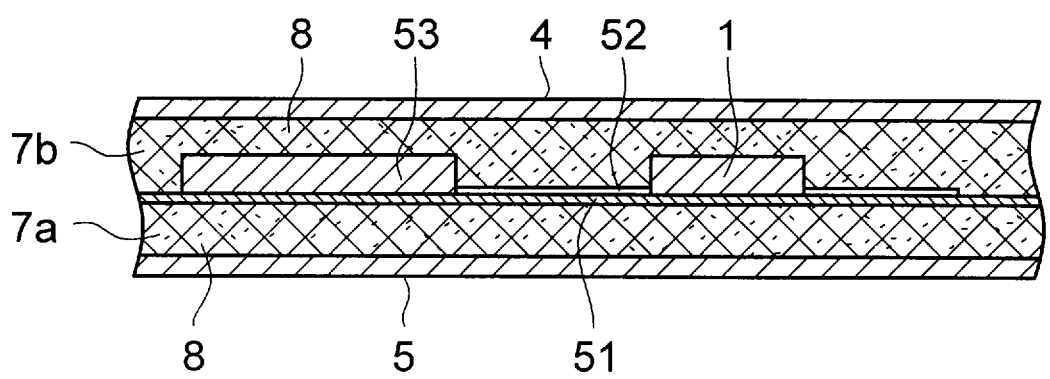
FIG. 17 is a cross-sectional view taken along the line 17—17 of FIG. 16.

A fourth example of the information carrier of the present invention is explained below with reference to FIG. 16 and FIG. 17. FIG. 16 is a partially sectioned plan view of this example of the information carrier. FIG. 17 is a cross-sectional view taken along the line 17—17 of FIG. 16.

As is clear from FIG. 16 and FIG. 17, the present example of the information carrier includes a substrate 3 composed of a first reinforcer 7a, a second reinforcer 7b, and a resin 8 infiltrated into them. A part obtained by mounting an IC module 1 on an insulating substrate 51 having a necessary pattern printed thereon is embedded as a fitting between the first and second reinforcers 7a and 7b.

Although any material may be used for the insulating substrat 51 so long as it has necessary insulating properties and permits printing of a necessary pattern, a paper or synthetic resin sheet is preferably used because they are thin, have excellent strength and permit easy printing thereon. Particularly when the insulating substrate 51 is made of paper impregnated with a resin, or the like, the substrate 3 and the insulating substrate 51 can be united in an indivisible body, so that an especially strong information carrier can be obtained.

The surface of the insulating substrate 51 has an electric conduction pattern 52 printed thereon by the use of an electrically conductive material, which includes a coil for communication, a wiring pattern, and electrode terminals for transmission of data and/or an electric source from or to external equipment. At the terminals of the electric conduction pattern 52, an electric or electronic part 53 is mounted such as an IC chip, IC module, capacitor, resistor, solar cell or liquid crystal display device. On the surface of the insulating substrate 51, not only an electric conduction pattern 52 maybe printed but also an image such as a design, bar code or photograph. Moreover, an optical recording medium or a magneto-optical recording medium (not shown) can also be attached to the surface of the insulating substrate 51.

Since other parts of this embodiment are the same as in the information carrier according to the second embodiment, explanation of the other parts is omitted to avoid duplication. In addition, explanation of a process for producing the present information carrier is also omitted because the procedure for the production is substantially the same as the process for producing the information carrier according to the second embodiment, except for the structure of the fitting used.

The present example of the information carrier has the same effect as that of the information carrier according to the first embodiment. Moreover, since the coil for communication is formed on the insulating substrate 51 by printing, production and handling of the coil is facilitated, so that the production cost of the information carrier can be reduced.

Fifth Embodiment

Figure 18:
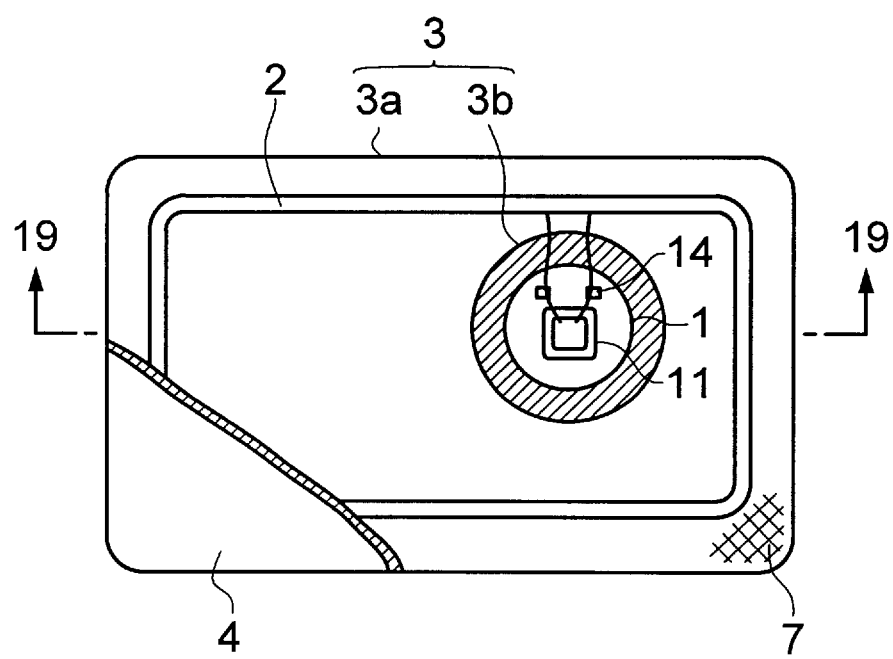
FIG. 18 is a plan view of an information carrier according to a fifth embodiment.
Figure 19:
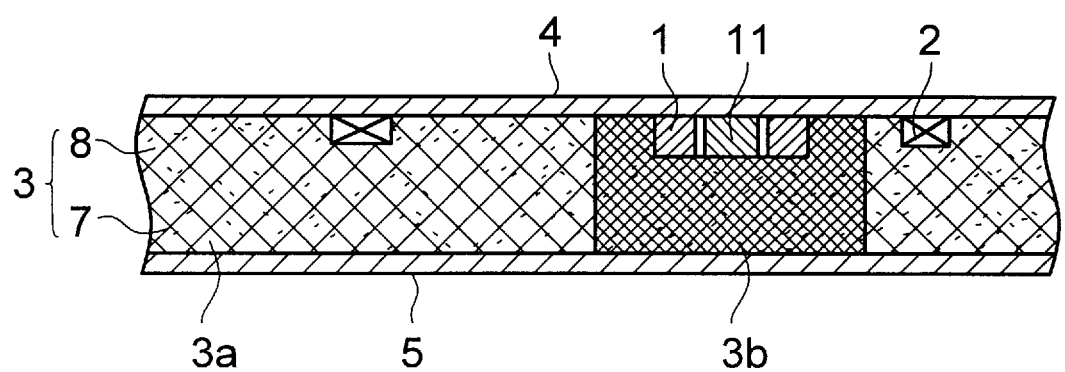
FIG. 19 is a cross-sectional view taken along the line 19—19 of FIG. 18.
Figure 20:
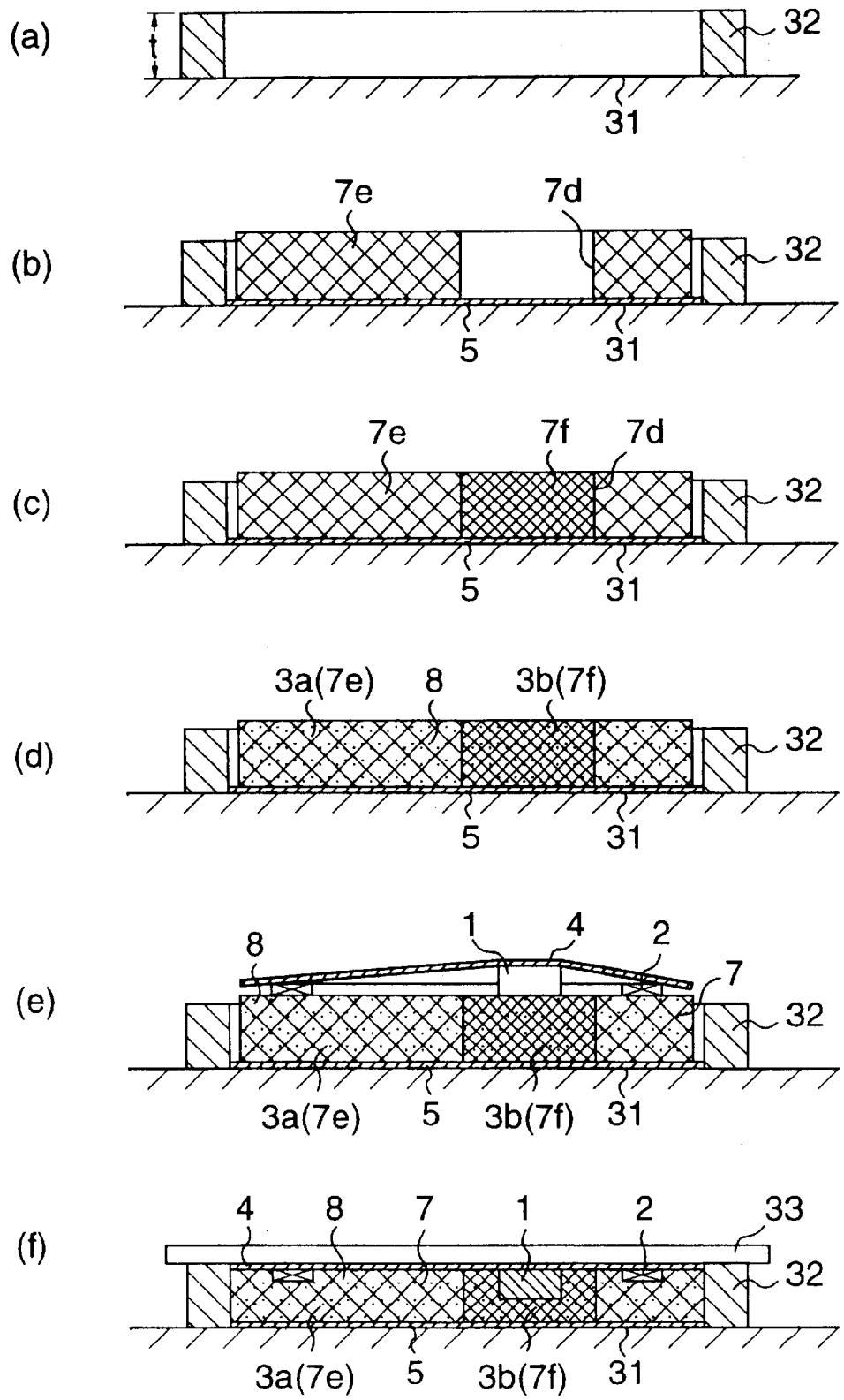
FIG. 20 is a chart illustrating a production process of the information carrier according to the fifth embodiment.
Figure 21:
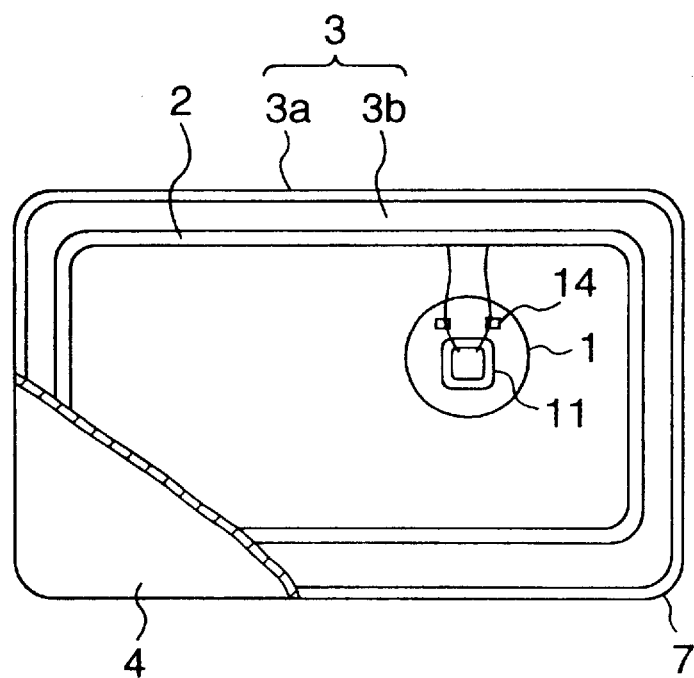
FIG. 21 is a plan view showing a modification of the information carrier according to the fifth embodiment.
Figure 22:
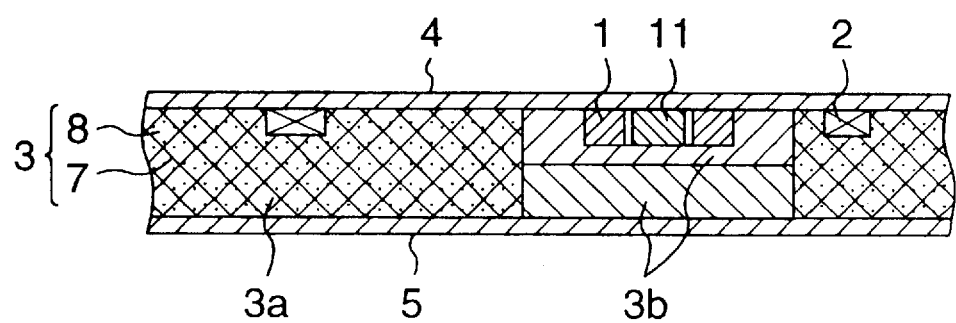
FIG. 22 is a plan view showing another modification of the information carrier according to the fifth embodiment.

A fifth example of the information carrier of the present invention is explained below with reference to FIG. 18 to FIG. 22. FIG. 18 is a plan view of this example of the information carrier. FIG. 19 is an enlarged cross-sectional view taken along the line 19—19 of FIG. 18. FIG. 20 is a chart illustrating a process for producing said information carrier. FIG. 21 is a plan view showing an example of modification of the present example of the information carrier. FIG. 22 is a plan view showing another example of modification of the present example of the information carrier.

As is clear from FIG. 18, FIG. 19, FIG. 21 and FIG. 22, the present example of the information carrier has a substrate 3 composed of a first component 3a and a second component 3b which are different in physical or chemical properties. Physical or chemical properties of the components 3a and 3b can be adjusted by changing, as shown in FIG. 18, FIG. 19 and FIG. 21, either the reinforcer and resin which constitute the substrate 3, without changing the structure of the substrate 3 itself, or by laminating, as shown in FIG. 22, reinforcers of the same kind or different kinds at a portion wherein the physical or chemical properties are to be changed, in a larger number than in the other portion.

FIG. 18, FIG. 19 and FIG. 22 show cases where a place of setting an IC module 1 and a region around said place are given physical or chemical properties different from those of the other region. FIG. 21 shows a case where the peripheral portion of the substrate 3 is given physical or chemical properties different from those of the inner portion. When the structure shown in FIG. 18 and FIG. 19 or in FIG. 22 is employed, the protective effect on the IC module 1 can be enhanced while maintaining the flexibility of the portions other than a the vicinity of the place of setting the IC module, by making the area adjacent to the IC module more rigid vicinity rigider than the other portion or imparting magnetic shielding properties to the vicinity. When the structure shown in FIG. 21 is employed, cutting is made easier by making the peripheral portion of the substrate 3 more flexible than the inner portion, so that shaping the substrate 3 is easier while maintaining the strength of the substrate 3.

Since other parts are the same as in the information carrier according to the first embodiment, explanation of the other parts is omitted to avoid duplication.

The present example of the information carrier has the same effect as that of the information carrier according to the first embodiment.

Also, since the substrate 3 is composed of the first component 3a and the second component 3b which are different in physical or chemical properties, an arbitrary portion can be given certain properties, so that the information carrier can be produced as a more highly reliable one.

Sixth Embodiment

Figure 23:
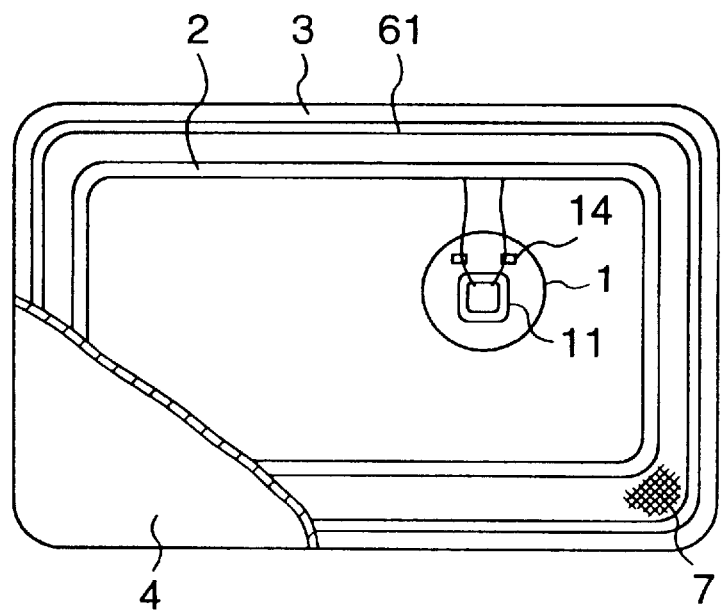
FIG. 23 is a plan view of an information carrier according to a sixth embodiment.
Figure 24:
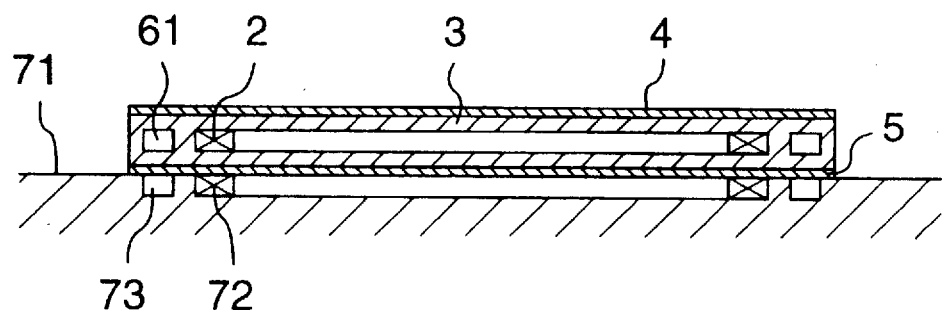
FIG. 24 is a cross-sectional view of the information carrier according to the sixth embodiment in use.

A sixth example of the information carrier of the present invention is explained below with reference to FIG. 23 and FIG. 24. FIG. 23 is a plan view of this example of the information carrier. FIG. 24 is a cross-sectional view of said information carrier in use.

As is clear from these drawings, the present example of the information carrier includes a magnetism-positioning mechanism 61 for exactly opposing a coil 2 mounted on a substrate 3 to a coil 72 provided in a piece of external equipment 71, mounted on the substrate 3. When the external equipment 71 is equipped with a magnet used as a carrier-positioning mechanism 73, a ferromagnetic material is mounted on the substrate 3 as the magnetism-positioning mechanism 61. When the external equipment 71 is equipped with a ferromagnetic material used as a carrier-positioning mechanism 73, a magnet is mounted on the substrate 3 as the magnetism-positioning mechanism 61. In FIG. 23, the magnetism-positioning mechanism 61 is formed into a frame shape and located along the periphery of the substrate 3, but the shape and location of the magnetism-positioning mechanism 61 are not limited only to this, and a magnetism-positioning mechanism 61 with an arbitrary shape may be mounted at an arbitrary location. The present example of the information carrier can be also be produced by mounting the magnetism-positioning mechanism 61 at the time of mounting a fitting on a reinforcer which constitutes the substrate 3. Since other parts are the same as in the information carriers according to the above-mentioned embodiments, explanation of the other parts is omitted for avoiding duplication.

The present example of the information carrier has the same effect as that of the information carrier according to the above-mentioned first embodiment. Furthermore, the magnetism-positioning mechanism 61 such as a magnet or ferromagnetic material is mounted on the substrate 3. Therefore when the present example of the information carrier is attached, as shown in FIG. 24, to the external equipment 71 equipped with a carrier-positioning mechanism 73, this causes mutual magnetic attraction between this mechanism and the magnetism-positioning mechanism 61. Therefore, the coil 2 mounted on the substrate 3 and the coil 72 provided in the external equipment 71 are opposed to each other automatically with high precision, so that the efficiency of receiving of electric power and the accuracy of giving and receiving of signals are enhanced.

Seventh Embodiment

Figure 25:
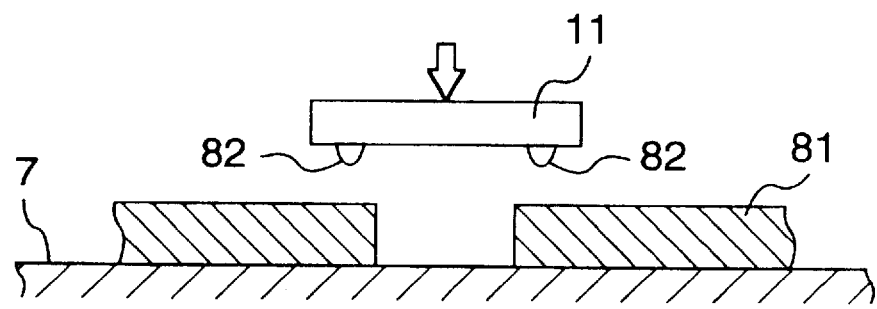
FIG. 25 is a cross-sectional view of the principal portion of an information carrier according to a seventh embodiment.
Figure 26:
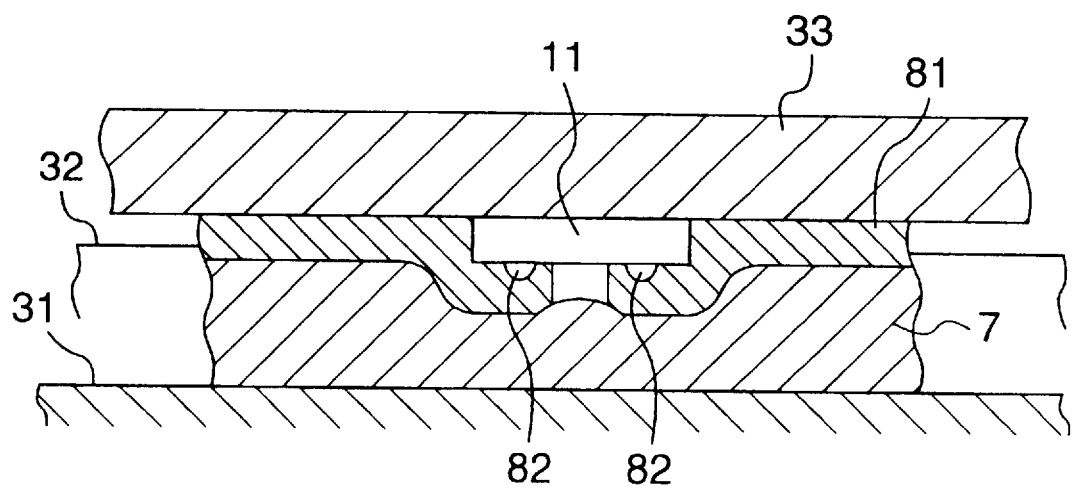
FIG. 26 is a chart illustrating a production process of the information carrier according to the seventh embodiment.

A seventh example of the information carrier of the present invention is explained with reference to FIG. 25 and FIG. 26. FIG. 25 is a cross-sectional view of the principal portion of this example of the information carrier. FIG. 26 is a chart illustrating a process for producing the present example of the information carrier.

As is clear from FIG. 25, the present example of the information carrier is characterized in that a circuit pattern 81 is formed directly on a reinforcer 7 and that an electronic part 11 acting as a fitting is connected to the circuit pattern 81. Said circuit pattern 81 can be formed, for example, by pattern printing and can be incorporated with a coil used for contactless transmission of data and/or electric power. The connection of the electronic part, such as an IC chip 11, to the circuit pattern 81 can be carried out by, as shown in FIG. 26, placing the reinforcer 7 having the circuit pattern 81 formed thereon in a frame 32 rested on a surface plate 31, impregnating or coating the reinforcer 7 with a resin, mounting the IC chip 11 at a predetermined position on the circuit pattern 81, and pressing the IC chip 11 downward with a press plate 33 to electrically connect the terminals 82 of the IC chip 11 to the circuit pattern 81. Since other parts are the same as in the information carriers according to the above-mentioned embodiments, explanation of the other parts is omitted for avoiding duplication.

The present example of the information carrier has the same effect as that of the information carrier according to the above-mentioned first embodiment. Furthermore, since the circuit pattern 81 is formed directly on the reinforcer 7 and the electronic part as fitting is connected to the circuit pattern 81, the number of parts can be reduced, compared with mounting an IC module, an insulating substrate, etc. which are separately formed on a reinforcer, so that the production cost of the information carrier can be reduced.

The present invention is characterized by using a sheet-like material which is deformable in the direction of its thickness, as a reinforcer in a substrate. The shapes, structures and sizes of the members constituting the information carrier, materials for the members, processes for producing the members are not limited by the above-mentioned embodiments. Other embodiments of the present invention are described below.

Figure 27:
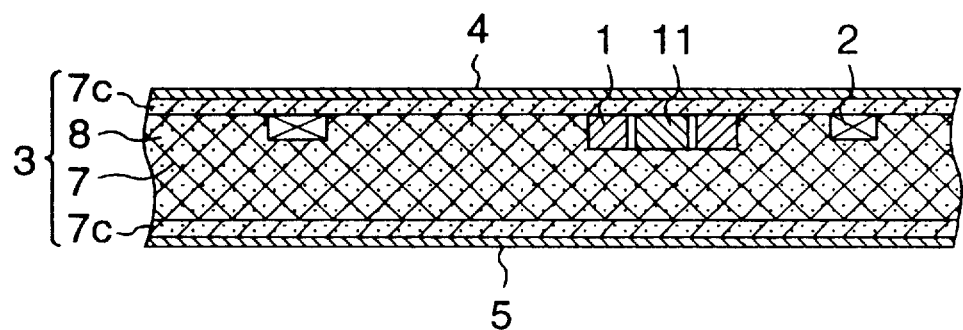
FIG. 27 is a plan view of an information carrier according to another embodiment.

① Although in the above-mentioned embodiments, a single reinforcer made of a sheet-like material deformable in the direction of its thickness is located on one side or each side of a fitting such as an IC module, it is also possible to laminate two or more reinforcers which are the same as or different from the kind of the aforesaid reinforcer. FIG. 27 is a cross-sectional view of an example of such an information carrier: a reinforcer 7c made of a sheet-like material hardly deformable in the direction of its thickness is laminated on each of the top surface and the under surface of a reinforcer 7 made of a sheet-like material markedly deformable in the direction of its thickness. Both of these reinforcers 7 and 7c are impregnated with a resin 8, whereby a substrate 3 is obtained. An IC module 1 and a coil 2 are embedded in the reinforcer 7, and the right surfaces of the hardly deformable reinforcers 7c become smooth and flat. Furthermore, top and bottom cover sheets 4 and 5 are attached to the right surfaces, respectively, of reinforcers 7c, whereby an information carrier is obtained. The reinforcer 7c may be located only one side of the reinforcer 7.

② In the above-mentioned embodiments, contactless type information carriers obtained by embedding an IC module 1 and a coil 2 in a substrate 3, and processes for production thereof are explained, though a contact type information carrier can also be produced using the first embodiment or the third embodiment. In detail, in the preparation of a substrate 3, an IC module 1, obtained by forming electrode terminals for transmission of data and/or an electric power on a protective frame 12, is embedded in substrate 3 so that the electrode terminals appear above the surface of this substrate 3, instead of embedding an IC module 1 and a coil 2 in substrate 3. Also, a design is printed directly on a portion other than the electrode terminals without attaching a cover sheet to at least the surface above which the electrode terminals appear, or a cover sheet having a through hole for exposing the electrode terminals is attached to the surface above which the electrode terminals appear, whereby a contact type information carrier can be produced.

③ In the above-mentioned embodiments, an IC module 1 and a coil 2 are example of fittings to be mounted on a substrate 3. However, there can be mounted IC chips, mechanisms for contactless transmission other than coils, capacitors, resistors, solar cells, liquid crystal display devices, optical recording media, magneto-optical recording media, etc. mounted along with or in place of an IC module or coil.

Figure 28:
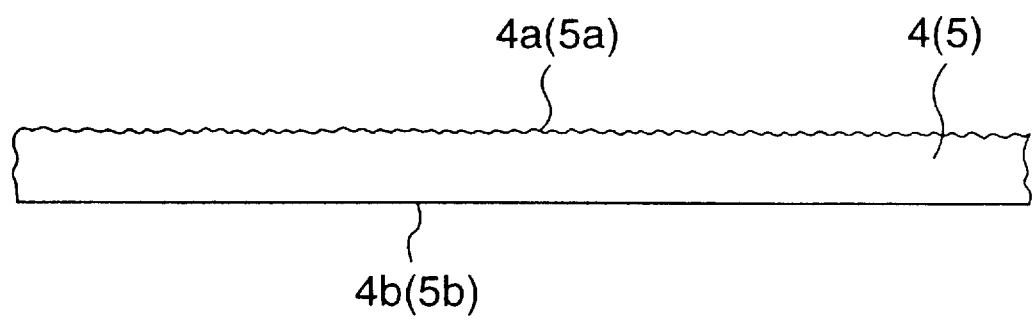
FIG. 28 is a cross-sectional view showing an example of the structure of a cover sheet.
Figure 29:
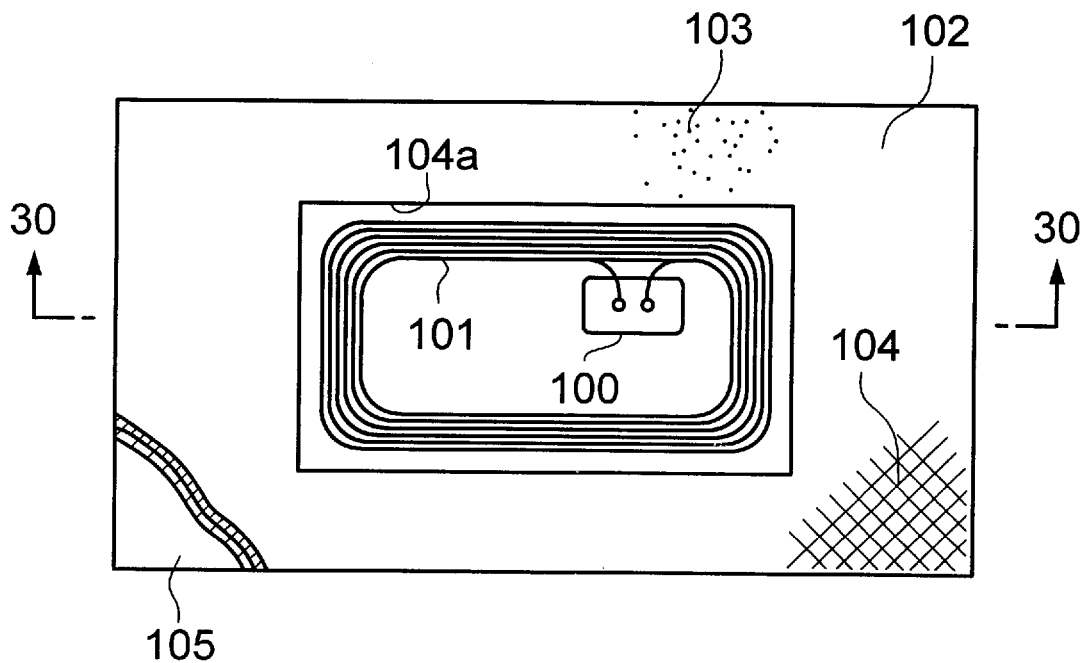
FIG. 29 is a partially sectioned plan view of an example of conventional information carrier.
Figure 30:
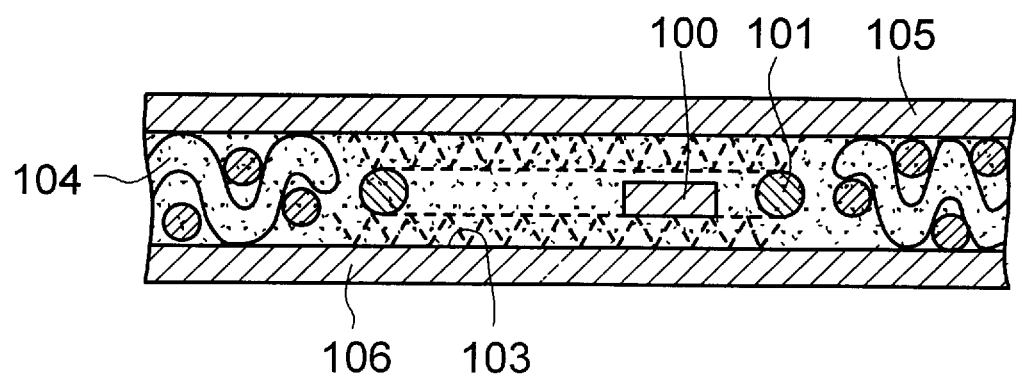
FIG. 30 is a cross-sectional view taken along the line 30—30 of FIG. 29.
Figure 31:
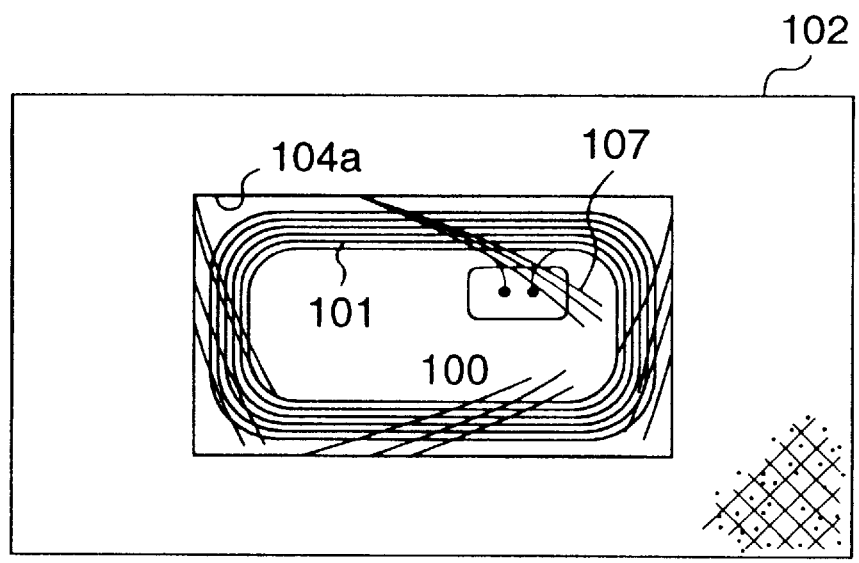
FIG. 31 is a partially sectioned plan view of a defective information carrier produced by a conventional technique.
Figure 32:
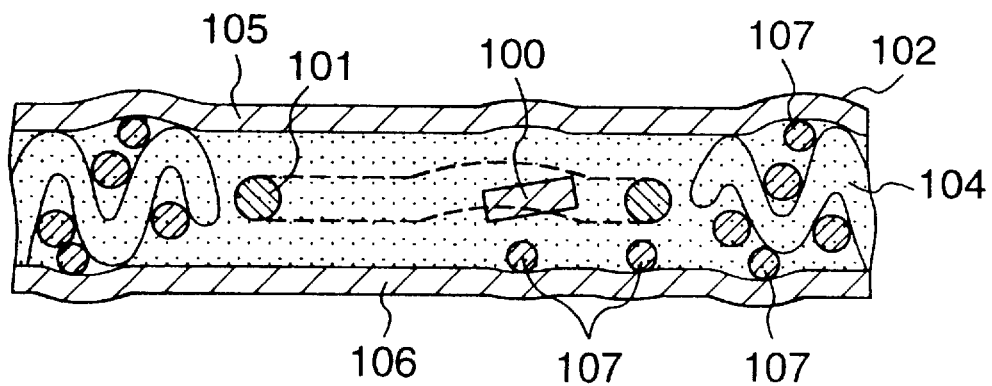
FIG. 32 is a cross-sectional view of the defective information carrier produced by the conventional technique.

④ In the above-mentioned embodiments, a top cover sheet 4 and a bottom cover sheet 5 are attached to the top surface and under surface, respectively, of a substrate 3, though an information carrier can be produced also by omitting at least one of the cover sheets and printing a design directly on the side on which the cover sheet is omitted. Cover sheets having very small concavities and convexities on both of the right and reverse sides as shown in FIG. 28 are preferably used to improve adhesion to the substrate 3 and the printability of the cover sheets. In this case, concavities and convexities corresponding to abrasive grain sizes No. 400 to No. 1000 (prescribed by JIS) are preferably formed on the adhesive surface to the substrate 3 in order to increase the adhesive surface area to improve adhesion. Concavities and convexities corresponding to abrasive grain sizes No. 3000 to No. 10000 (prescribed by JIS) are preferably formed on the right surface (printing surface) in order to enhance the spreadability of ink to improve printability. As a process for producing such a cover sheet, a filler with a diameter of 0.1 $\mu$m to several tens of $\mu$m (abrasive grain or the like can be used) is embedded in a raw sheet for the cover sheet by electrostatic static coating. Then, the a process of kneading the aforesaid filler is kneaded with a material for the cover sheet.

⑤ In the above-mentioned embodiments, a reinforcer 7 is placed in a frame 32 or cavities 41a and 42a at first, after which a resin 8 is injected in the frame 32 or the cavities 41a and 42a to be infiltrated into the reinforcer 7. However, a required information carrier can also be produced by placing a reinforcer 7 previously impregnated with a resin 8 in such a frame 32 or cavities 41a and 42a, instead of carrying out the above procedure.

⑥ In the above-mentioned embodiments, a molded article for producing an information carrier is prepared and then its peripheral portion is cut and shaped to produce an information carrier of a required shape and a required size. However, the step of cutting and shaping may be omitted when the information carrier of the desired shape and the desired size can be produced using a frame 32 or cavities 41a and 42a.

⑦ Similarly, in the above-mentioned embodiments, a substrate 3 of a required shape and a required size is molded one at a time by using a frame 32 or cavities 41a and 42a. Multi-impression molding of a plurality of substrates 3 of a required shape and a required size can also be carried out by producing a frame 32 or cavities 41a and 42a of a size corresponding to a plurality of the required substrates 3 or a larger size, producing molded articles as materials for substrates 3, and cutting and shaping their predetermined portions.

⑧ In the above-mentioned embodiments, a frame 32 and a press plate 33 are used as members for press-molding a substrate 3. It is also possible to omit the frame 32 and use a roller equipped with a mechanism for regulating its decreasing height (during pressing) above a surface plate 31, in place of the press plate 33.

⑨ In addition, in the above-mentioned embodiments, card-like information carriers are exemplified in the drawings, but the gist of the present invention is not limited by them. The present invention can be applied to the production of an information carrier of an arbitrary shape such as coin shape.

As described above, according to the present invention, in an information carrier, a sheet-like material deformable in the direction of the its thickness is used as a reinforcer for a resin which constitutes the substrate of the information carrier, so that one or more fittings (such as an IC module) can be embedded in the reinforcer without making a cut-out hole in the reinforcer. Therefore, the reinforcer is present throughout the substrate, so that even when the substrate receives an irregular external force such as flexure, stress is not centered on only a part of the substrate. An information carrier can therefore be produced which is hardly cracked and is excellent in durability. In addition, information carriers with different kinds and sizes of fitting can be produced using the same reinforcer, so that such inexpensive information carriers can be efficiently produced. Furthermore, smooth surfaces can be obtained on the right and reverse sides of the substrate because the thickness of the substrate is not made nonuniform by fiber jutting out of the cut surface of a reinforcer, as is conventially known. Therefore, the appearance of the information carrier can be made satisfactorily beautiful. When, for example, a photograph of owner's face is printed on the surface of the substrate or the surface of a cover sheet attached to the surface of the substrate, the photograph of the face or the like can be clearly printed. In addition, low cost production is possible because an additional treatment for stopping the fraying of fiber may be omitted.

On the other hand, in producing an information carrier, there is employed a production process comprising using a sheet-like material deformable in the direction of its thickness as a reinforcer in a substrate, and applying a load to a portion of the reinforcer in the direction of the reinforcer thickness selectively where at least one fitting is to be set. Therefore, irregular movement of the fitting(s) can be prevented without any special treatment for stopping a resin flow, so that the fitting(s) can be positioned with high precision. Accordingly, in an information carrier having a coil mounted thereon, the coil can be exactly positioned relative to the coil of an external piece of equipment with high precision, so that efficient receiving of electric power and efficient giving and receiving of signals are possible. As to the IC module, irregular tension applied to the junction of the coil with the IC module can be reduced, so that the reliability and durability of the information carrier can be enhanced.

What is claimed is:

1. An information carrier comprising:
    a substrate composed of a reinforcing material which is deformable in a thickness direction of said reinforcing material;
    a coil constructed and arranged for non-contact transmission of data and/or electric power; and
    a resin applied on or infiltrated into said substrate, said resin retaining a definite shape and strength after curing thereof,
    said coil being embedded in a hollow press-formed in said substrate.

2. An information carrier according to claim 1, wherein said reinforcing material is any one of paper, leather, sheet-like materials having deformability imparted by a chemical or thermal treatment, and a combination thereof.

3. An information carrier according to claim 1, wherein said reinforcing material is any one of woven fabric, knit fabric, and nonwoven fabric.

4. An information carrier comprising:
    a substrate composed of a reinforcing material which is deformable in a thickness direction of said reinforcing material;
    a fitting selected from the group consisting of: electrode terminals for transmission of data and/or and electric source, capacitors, resistors, solar cells, liquid crystal display devices, image displayers, optical recording media, magneto-optical recording media, and magnets or ferromagnetic materials for locating the information carrier at the carrier-setting position of a reader-writer with high precision, either singly or in combination; and
    a resin applied on or infiltrated into said substrate, said resin retaining a definite shape and strength after curing thereof,
    said fitting being embedded in a hollow press-formed in said substrate.

5. An information carrier according to claim 3, wherein said woven fabric, knit fabric and nonwoven fabric each comprise fibers selected from the group consisting of selected from carbon fiber, Kevlar fiber, and a combination of two or more kinds of fibers selected from the group.

6. An information carrier according to claim 3, wherein as said woven fabric and knitted fabric is woven and knitted, respectively, out of single yarn or doubled and twisted yarn, and is given such a compressibility that a fitting supported on the substrate can be embedded in the direction of the thickness.

7. An information carrier according to claim 1, wherein said resin is any one of ultraviolet light-setting resins, thermosetting resins and chemical reaction-setting resins.

8. An information carrier according to claim 1, further comprising an IC module comprising at least an IC chip mounted in a protective frame having a thickness at least equal to that of said IC chip, said protective frame including a through hole in which said IC chip is mounted and an electric conduction pattern formed on a surface thereof.

9. An information carrier according to claim 8, wherein said IC chip is mounted in said protective frame with a resin which is more flexible than said protective frame.

10. An information carrier according to claim 8, wherein said IC chip includes input and output terminals which are electrically connected to said electric conduction pattern formed on said protective frame.

11. An information carrier according to claim 10, wherein a circuit pattern is formed on a surface of said reinforcing material and is connected to said input and output terminals of said IC chip.

12. An information carrier according to claim 11, wherein said coil is said circuit pattern formed on said reinforcing material.

13. An information carrier according to claim 1, wherein said coil is embedded in an indent press-formed in one side of said substrate, and wherein opposing faces of said substrate are planarized.

14. An information carrier according to claim 1, wherein said substrate is composed of two portions of reinforcing material which are each deformable in the direction of their respective thicknesses and a resin applied on or infiltrated into said two reinforcing material portions, said coil being embedded in a hollow defined in respective opposing surfaces of said two reinforcing material portions, wherein outwardly facing surfaces of said two reinforcing material portions are flat.

15. An information carrier according to claim 14, further comprising an insulating substrate provided between said two reinforcing material portions.

16. An information carrier according to claim 15, wherein said insulating substrate is composed of a plurality of reinforcing material portions which are deformable in a thickness direction and a resin applied on or infiltrated into said plurality of reinforcing material portions.

17. An information carrier according to claim 15, wherein said insulating substrate is printed with at least one of a design, a bar code, a photograph and a circuit pattern.

18. An information carrier according to claim 1, wherein said substrate includes a region having different physical or chemical properties from a remainder of said substrate.

19. An information carrier according to claim 18, wherein said region is more flexible than a remainder of said substrate, an IC chip being located at said region.

20. An information carrier according to claim 18, wherein said region is located at a periphery of said substrate and is more flexible than a remainder of said substrate.

21. An information carrier according to claim 18, wherein said region comprises a different reinforcing material or resin than a remainder of said substrate, thereby yielding different physical or chemical properties of said region compared to said remainder of said substrate.

22. An information carrier according to claim 15, further comprising a laminate of a plurality of reinforcing material portions and a resin provided on at least one side of said substrate.

23. A process for producing an information carrier comprising the steps of:
    placing a deformable reinforcing material portion coated or impregnated with a resin on a surface plate;
    positioning a fitting on the reinforcing material portion;
    pressing the fitting by a limited amount so as to deform the reinforcing material portion in a thickness direction of the reinforcing material portion to thereby embed the fitting in the reinforcing material portion; and
    curing the resin.

24. A process for producing an information carrier according to claim 23, wherein said step of placing the reinforcing material portion on the surface plate comprises placing the reinforcing material portion in a frame resting on the surface plate; and said step of pressing the fitting comprises pressing the fitting with a pressing member until a pressing surface of the pressing member contacts the frame, whereby a thickness and shape of the substrate are regulated and a surface of the substrate and a surface of the fitting are made coplanar.

25. A process for producing an information carrier according to claim 24, wherein the pressing member is one of a press plate and a press roller.

26. A process for producing an information carrier according to claim 23, wherein said steps of placing the reinforcing material portion on the surface plate and positioning the fitting comprises placing a first deformable reinforcing material portion on the surface plate, positioning a fitting on the first reinforcing material portion, and placing a second reinforcing material portion on said first reinforcing material portion having the fitting positioned thereon.

27. A process for producing an information carrier according to claim 26, further comprising a step of electrically connecting the fitting to a circuit pattern formed on the reinforcing material portion.

28. A process for producing an information carrier according to claim 23, wherein in said step of placing the the reinforcing material portion on the surface plate comprises placing a first component of the reinforcing material portion having a through hole formed therethrough, and providing a second component of the reinforcing material portion having different physical or chemical properties from the first component thereof in the through hole.

29. A process for producing an information carrier according to claim 24, wherein said step of placing the the reinforcing material portion in the frame comprises placing the reinforcing material portion neither coated nor impregnated with the resin in the frame and a coating or impregnating the the reinforcing material portion placed in the frame with the resin.

30. A process for producing an information carrier according to claim 23, wherein said step of placing the reinforcing material portion in the frame comprises impregnating the reinforcing material portion with the resin and a step of placing the reinforcing material portion impregnated with the resin in the frame.

31. A process for producing an information carrier according to claim 23, wherein the reinforcing material portion is a first reinforcing material portion, the process further comprising a step of placing a second reinforcing portion on at least one side of the first reinforcing material portion.

32. A process for producing an information carrier according to claim 23, comprising a step of placing a cover sheet on at least one side of the reinforcing material portion.

33. A process for producing an information carrier according to claim 23, further comprising a step of providing a cover sheet and a second reinforcing material portion on at least one side of the reinforcing material portion.

34. A process for producing an information carrier comprising the steps of:

positioning a fitting in a cavity of a mold;

placing a deformable reinforcing material portion coated or impregnated with a reactive agent containing a curing agent, in the cavity over the fitting;

clamping a top force and a bottom force of the mold; and curing the reactive resin.

* * * * *